United States Patent

Sugawara et al.

[11] Patent Number: 6,083,670
[45] Date of Patent: Jul. 4, 2000

[54] PROCESS AND EQUIPMENT FOR REJUVENATION TREATMENT OF PHOTORESIST DEVELOPMENT WASTE

[75] Inventors: Hiroshi Sugawara, Omiya; Hiromi Henmi, Kawagoe, both of Japan

[73] Assignee: Organo Corporation, Tokyo-To, Japan

[21] Appl. No.: 09/217,280

[22] Filed: Dec. 21, 1998

[30] Foreign Application Priority Data

Jan. 5, 1998 [JP] Japan .................................. 10-010025

[51] Int. Cl.$^7$ .................................................. G03C 5/31
[52] U.S. Cl. ............................................................ 430/399
[58] Field of Search ............................................. 430/399

[56] References Cited

FOREIGN PATENT DOCUMENTS 57-155390  9/1982  Japan .
7-328642  12/1995  Japan .

OTHER PUBLICATIONS

Derwent abstract of 57–155390, Week 198244 B, 1997.
Derwent abstract of 7–328642, Week 199608 B, 1997.

Primary Examiner—Hoa Van Le
Attorney, Agent, or Firm—Norris, McLaughlin & Marcus, P.A.

[57] ABSTRACT

The disclosed process for rejuvenation treatment of a photoresist development waste mainly containing a photoresist and tetraalkylammonium (TAA) ions comprises at least a simple membrane separation step of treating the photoresist development waste or a treated solution derived from the photoresist development waste with a nanofiltration membrane (NF membrane) to obtain a concentrate (NF concentrate) mainly containing impurities such as the photoresist and a higher-purity permeate (NF permeate) mainly containing TAA ions. The NF concentrate and/or the NF permeate, preferably the NF permeate, is desirably subjected to a step of concentration and refining by electrodialysis or electrolysis and/or a step of refining by ion exchange treatment, for example, with an anion exchange resin and/or a cation exchange resin in one of the H form and the TAA form. The NF permeate may advantageously be passed through the concentrating cells of an electrodialysis unit while passing the NF concentrate through the desalting cells of the electrodialysis unit to further recover TAA ions remaining in the NF concentrate, whereby the amount of wastewater discharged as the desalted waste can be decreased. The NF membrane separation step is preferably effected in multiple stages.

8 Claims, 7 Drawing Sheets

PROCESS AND EQUIPMENT FOR REJUVENATION TREATMENT OF PHOTORESIST DEVELOPMENT WASTE

FIELD OF THE INVENTION

The present invention relates to process and equipment for rejuvenation treatment of a photoresist development waste containing a photoresist and tetraalkylammonium ions and resulting from the process of producing electronic parts such as semiconductor devices (LSI, VLSI, etc.), liquid crystal displays (LCD) and printed boards, or the like.

RELATED ART

In production of electronic parts such as semiconductor devices, liquid crystal displays and printed boards, and the like, a film of a negative or positive photoresist is formed on a substrate such as a wafer or a glass substrate, then irradiated in predetermined part thereof with a light or the like, and subsequently developed with a developer through dissolution therein of the unnecessary part of the photoresist, and the substrate is further subjected to etching or the like treatment, followed by removal of the insoluble photoresist film remaining on the substrate. Photoresists include positive photoresists which turn soluble where exposed to a light or the like, and negative photoresists which turn insoluble where exposed to a light or the like. The mainstream developers for the positive photoresists are alkali developers. Although the mainstream developers for the negative photoresists are organic solvent developers, alkali developers may also be used for some negative photoresists.

An aqueous solution of a tetraalkylammonium hydroxide (hereinafter often referred to in brief as "TAAH") is usually used as one of the above-mentioned alkali developers. Thus, the dissolved photoresist and tetraalkylammonium ions (hereinafter often referred to in brief as "TAA ions") are usually contained in a waste discharged from the process of development (called "photoresist development waste" and hereinafter often referred to in brief as "development waste"). Herein, although the counter ions of TAA ions are usually hydroxide ions (OH–) as is apparent from the foregoing, other ions may be some of the counter ions to form a salt(s) because such a waste (wastewater), which differs from factory to factory, may be mixed with any foreign matter or may possibly be mixed with other wastewater in some cases. Accordingly, the counter ions are not specified and the expression is instead made under the idea of "ions" in the generic description of the instant specification. Since TAA ions in the waste usually exist in the TAAH form as described above, however, the present invention will be described with priority given thereto.

Conventional methods of treating development waste containing photoresist and TAA ions include a method wherein all the waste is entrusted to a contractor for off-site disposal thereof, a method wherein the waste is concentrated by evaporation or reverse osmosis, followed by disposal (incineration or off-site disposal by contractor) thereof, and a method wherein the waste is subjected to biodegradation treatment with activated sludge, and then discharged. Besides, in the case of a waste concentrated in the above-mentioned manner or a thick photoresist waste having a high TAA ion concentration from the beginning, there have been made attempts to concentrate, recover and reutilize TAA ions preferably in the hydroxide form by electrodialysis or electrolysis (naturally recovered in the hydroxide form by electrolysis) (see Japanese Patent Laid-Open No. 328,642/1995 and Japanese Patent Laid-Open No. 17,889/1993).

The concentration method comprising evaporation or reverse osmosis involves concentration of the alkali-soluble photoresist as well as TAA ions, with the result that the resulting concentrated waste must inevitably be disposed of. The method comprising biodegradation treatment with activated sludge is only capable of treating a low-concentration waste while requiring large-scale treatment facilities because the biodegradability of TAA ions is poor and proliferation of microorganisms capable of degrading other organic components, if mixed in the waste, becomes rather active while inactivating proliferation of microorganisms capable of degrading TAA ions to further deteriorate the biodegradability thereof. On the other hand, the method of recovering TAA ions preferably in the hydroxide form through concentration thereof by electrodialysis or electrolysis, though best in aspects of a countermeasure against pollution, efficient utilization of resources, etc., involves problems of a high running cost for securing a high purity and almost no or a slight decrease in the amount (volume) of wastewater discharged in the form of a desalted waste.

Accordingly, an object of the present invention is to provide process and equipment for rejuvenation treatment of photoresist development waste by which the running cost can be lowered with elimination of the forgoing drawbacks to the conventional methods of treating development waste containing photoresist and TAA ions. Another object of the present invention is to provide process and equipment for rejuvenation treatment of photoresist development waste by which the amount (volume) of wastewater to be disposed of can be decreased.

SUMMARY OF THE INVENTION

According to the present invention, there are provided a process for rejuvenation treatment of a photoresist development waste mainly containing a photoresist and tetraalkylammonium ions, comprising at least the membrane separation step (A) of treating the photoresist development waste or a treated solution derived from the photoresist development waste with a nanofiltration membrane (hereinafter referred to as an "NF membrane") to obtain a concentrate mainly containing impurities such as the photoresist and a permeate mainly containing tetraalkylammonium ions; equipment for rejuvenation treatment of a photoresist development waste, comprising at least one nanofilter provided with an NF membrane for obtaining a concentrate mainly containing impurities such as a photoresist and a permeate mainly containing tetraalkylammonium ions from the photoresist development waste or a treated solution derived from the photoresist development waste, and an electrodialysis or electrolysis unit comprising a desalting cell or desalting cells for passage therethrough of the concentrate and a concentrating cell or concentrating cells for passage therethrough of the permeate, and optionally further comprising an ion exchange treatment unit and further optionally a membrane treatment unit at or near the terminal of the equipment; and equipment for rejuvenation treatment of a photoresist development waste, comprising an evaporation or reverse osmosis membrane treatment unit for obtaining a concentrate from the photoresist development waste or a treated solution derived from the photoresist development waste, at least one nanofilter provided with an NF membrane for membrane separation of the concentrate, and an ion exchange treatment unit for treatment of a permeate obtained by said at least one nanofilter with an ion exchange resin, and optionally further comprising a membrane treatment unit at or near the terminal of the equipment.

The NF membrane to be used in the present invention is a separation membrane having a molecular cutoff falling within the range of 100 to 1,000 and characterized by a rejection of at most 90% against sodium chloride when a 0.2% (wt./vol.) aqueous solution of sodium chloride as a solution to be treated is subjected to separation treatment with the membrane at 25° C.

An NF membrane having a surface thereof charged negative is preferably used as a membrane principally aimed at separation and removal of the photoresist into the concentrate. Since the photoresist usually exists in the anionic form in the development waste or the treated solution derived therefrom, the use of the NF membrane having a surface thereof charged negative improves the rejection against the photoresist and hardly brings about fouling (contamination) of the NF membrane otherwise attributed to attachment thereto of the photoresist. In this case, an anionic surfactant can also be effectively separated and removed into the concentrate when the development waste or the treated solution derived therefrom contains the anionic surfactant. Further, in general, the NF membrane is also capable of separating and removing a nonionic surfactant, a cationic surfactant, etc. into the concentrate. Needless to say, an NF membrane having a surface thereof charged positive or a neutral NF membrane may also be used in accordance with properties of the development waste or the treated solution derived therefrom (e.g., the kind of surfactant, if contained therein).

Examples of the NF membrane include NTR-7410, NTR-7450, NTR-725HF, NTR-7250, NTR-729HF, and NTR-769SR manufactured by NITTO DENKO CORPORATION; SU-200S, SU-500, and SU-600 manufactured by Toray Industries, Inc.; NF-45, NF-55, NF-70, and NF-90 manufactured by FilmTec Corporation and sold by Dow Chemical Company; DESAL-5L and DESAL-5K manufactured by Desal Co. Limited; TS-80 manufactured by TrySep Corporation; and TFC-S manufactured by Fluid Systems.

The development waste containing TAAH and a photoresist is usually alkaline with a pH value of 12 to 14. The photoresist is dissolved in the form of a salt with TAA ions in the alkaline development waste due to its acid groups such as carboxyl groups and phenolic hydroxyl groups. The present invention can be applied to the alkaline development waste as it is. Since the NF membrane is comparatively weak against a high-pH solution, however, the pH of the development waste or the treated solution derived therefrom as water to be treated with the NF membrane is desired to be adjusted to at most 12 if necessary, and preferably to at most 11, for example, through neutralization thereof in order to prolong the life span of the NF membrane. Further, the development waste or the treated solution derived therefrom and containing the photoresist begins to precipitate the photoresist when the pH value thereof becomes lower than 9.5. In this case, therefore, a solution stripped of the precipitated photoresist by solid-liquid separation such as centrifugalization or filtration may as well be subjected to the step of separation with the NF membrane. By contrast, when that pH value is 9.5 or higher, the development waste or the treated solution derived therefrom can favorably be subjected as such to the step of separation with the NF membrane, In any case, however, it is preferred to provide a safety filter of at most 25 $\mu$m in pore size in front of the NF membrane in order to avoid a fear of clogging of the NF membrane with fine impurity particles and the like. This applies at whatever stage the step of separation with the NF membrane is taken.

TAA ions in the photoresist development waste are derived from TAAH, used as the alkali in the photoresist developer for use in production of various electronic parts and the like, examples of which include tetramethylammonium hydroxide (hereinafter referred to as "TMAH"), tetraethylammonium hydroxide, tetrapropylammonium hydroxide, tetrabutylammonium hydroxide, methyltriethylammonium hydroxide, trimethylethylammonium hydroxide, dimethyldiethylammonium hydroxide, trimethyl (2-hydroxyethyl)ammonium hydroxide (i.e., choline), triethyl(2-hydroxyethyl)ammonium hydroxide, dimethyldi (2-hydroxyethyl)ammonium hydroxide, diethyldi(2-hydroxyethyl)ammonium hydroxide, methyltri(2-hydroxyethyl) ammonium hydroxide, ethyltri(2-hydroxyethyl)ammonium hydroxide, and tetra(2-hydroxyethyl)ammonium hydroxide (the former two and choline in particular).

The counter ions of TAA ions in the development waste are usually hydroxide ions (OH-) as described above. In some factory and/or in the case where neutralization is done as will be described later, however, at least part of the counter ions of TAA ions may generally be at least one kind of anions selected from among inorganic anions such as fluoride ions, chloride ions, bromide ions, carbonate ions, hydrogencarbonate ions, sulfate ions, hydrogensulfate ions, nitrate ions, phosphate ions, hydrogenphosphate ions and dihydrogenphosphate ions, and organic anions such as formate ions, acetate ions, and oxalate ions. Carbonate ions and hydrogencarbonate ions in particular may often exist in a small amount because carbon dioxide gas in the air is liable to be dissolved in the development waste. Additionally stated, since the counter ions of TAA ions in the concentrate obtained through electrolysis are usually hydroxide ions, incorporation of at least an electrolysis step into the process of the present invention will suffice when the amount of the above-mentioned kind(s) of counter ions other than hydroxide ions is so large that a difficulty is encountered in reutilizing the resultant TAAH solution as a photoresist alkali developer.

The development waste containing photoresist and TAA ions may be directly subjected to the step of separation with the NF membrane in the process of the present invention. However, the treated solution derived from the development waste and obtained through a variety of pretreatment(s) as required may alternatively be subjected to the step of separation with the NF membrane.

This treated solution derived from the development waste may be a treated solution obtained by subjecting the development waste to at least one pretreatment step selected from the group consisting of a concentration treatment step (a) of obtaining a concentrate by at least one concentration method selected from the group consisting of reverse osmosis membrane treatment, evaporation, electrodialysis and electrolysis, a chromatographic separation step (b) of obtaining a TAA ion fraction by a chromatographic separation method [Japanese Patent Application No. 9-325148 (i.e., 325,148/1997), incorporated herein by reference in its entirety once laid open although it has not yet been published], a neutralization+solid-liquid separation step (c) of removing the photoresist insolubilized by neutralization by means of solid-liquid separation, and an ion exchange treatment step (d) of removing some impurities by adsorption thereof on an ion exchanger(s) through contact therebetween [Japanese Patent Laid-Open No. 85,741/1998, incorporated herein by reference in its entirety; and Japanese Patent Application No. 9-334800 (i.e., 334,800/1997), incorporated herein by reference in its entirety once laid open although it has not yet been published]. When a plurality of such pretreatment steps are taken, the order thereof may be arbitrary, and any proper order thereof may be chosen, for example, in accordance with the purpose of the pretreatment. It is a matter of course that an anion exchange resin and/or a cation exchange resin in at least one of the hydrogen ion form (H form) and the TAA ion form (TAA form) is preferably used as the ion exchanger in the step (d) from the standpoint of obtaining a high-purity rejuvenated developer. However, this is not limitative because the step (d) is a pretreatment and a suitable treatment, if taken in a later stage, will therefore suffice.

For example, a concentrate having TAA ions concentrated therein and obtained through the concentration treatment step (a) of treating the development waste by at least one concentration method selected from among reverse osmosis membrane treatment, evaporation, electrodialysis, and electrolysis may be used as the treated solution derived from the development waste because the TAA ion concentration of the development waste is usually lowered with rinsing water and the like. In this case, however, care must be taken because the operating pressure of a nanofilter rises as the TAAH concentration increases and because the life span of the NF membrane is shortened as the pH value rises. Where a plurality of such concentration methods are used in combination, the order thereof is not particularly limited and may be arbitrary. For example, when reverse osmosis membrane treatment and/or evaporation is followed by electrodialysis and/or electrolysis, there can be obtained advantages such as an improvement in current efficiency during electrodialysis and/or electrolysis, miniaturization and running cost reduction of an electrodialysis and/or an electrolysis unit(s) due to a decrease in the amount of the solution to be treated therewith, lowering of a voltage to be applied to such a unit(s), and an improvement in TAA ion recovery (Japanese Patent Application No. 334,800/1997). When the neutralization and solid-liquid separation step (c) and/or the ion exchange treatment step (d) is also taken in this case, this evaporation and/or reverse osmosis membrane treatment step may be taken at any stage, e.g., at first, later or between both. Additionally stated, either condensed water obtained by evaporation or permeate water obtained by reverse osmosis membrane treatment does not substantially contain the photoresist and TAA ions to be able to serve as process water or the like. In passing, in the case of reverse osmosis membrane treatment, the solution to be treated thereby preferably has a pH value of 9 to 12 from the standpoint of minimizing the deterioration of a reverse osmosis membrane.

Specific examples of other treated solutions derived from the development waste include a TAA ion fraction obtained by separation treatment of the development waste according to a chromatographic separation method [step (b)], a treated solution obtained through an activated carbon treatment step of treating the development waste with activated carbon (Japanese Patent Laid-Open No. 30,753/1983, incorporated herein by reference in its entirety), a treated solution obtained through a neutralization+solid-liquid separation step of neutralizing the development waste and removing the insolubilized photoresist (insolubilized when returned from the salt form back to the acid form) by solid-liquid separation such as centrifugalization or filtration [step (c)], a treated solution obtained through an ion exchange treatment step of removing some impurities by adsorption thereof on an anion exchanger (preferably an anion exchange resin) and/or a cation exchange resin (in the H form and/or in the TAA form) through contact therebetween [step (d)] (most of the photoresist is removed through contact with an anion exchanger such as an anion exchange resin), a treated solution obtained through the above-mentioned neutralization+solid-liquid separation step (c) and the above-mentioned ion exchange treatment step (d) [step (c)+step (d)], an aqueous solution of a TAA salt as an eluate obtained through a cation exchange+elution step of adsorbing TAA ions in the development waste on a cation exchanger and eluting TAA ions using an aqueous acid solution as an eluent (Japanese Patent Laid-Open No. 142,649/1994, incorporated herein by reference in its entirety), and treated and concentrated solutions obtained through any one(s) of these steps and any one(s) of the aforementioned concentration steps (the order thereof may be arbitrary). When neutralization is done, however, an electrolysis step is usually required in order to make TAA ions have hydroxide ions (OH ions) as the counter ions. When the chromatographic separation step (b) is taken, a size exclusion chromatographic packing is preferably used as the separating agent and a simulated moving bed method or a method similar thereto to which the former method is applied is preferably employed as the chromatographic separation method.

When a photoresist-containing solution such as the development waste is brought into contact with the anion exchange resin, the photoresist can be adsorbed on the anion exchange resin, whereby the photoresist can be highly selectively removed from the solution. The reason for this is believed to be as follows: The mainstream alkali-developable photoresists are those having a novolak resin as the matrix resin. This novolak resin has a large number of benzene rings. When a styrene type anion exchange resin having benzene rings or the like resin in particular is, for example, used as the anion exchange resin, it is believed that the photoresist can be efficiently and highly selectively removed due to affinity (hydrophobic) interaction between the respective benzene rings of the anion exchange resin and the photoresist in addition to the mutual electrostatic interaction thereof.

A treated solution obtained through the neutralization+solid-liquid separation step as mentioned above, a step of decomposing organics with ozone, hydrogen peroxide or ultraviolet radiation, and an electrolysis concentration step (Japanese Patent Laid-Open Nos. 41,979/1992, 17,889/1993 and 106,074/1993, incorporated herein by reference in their entirety) may alternatively be used as the treated solution derived from the development waste.

When the development waste or the treated solution derived therefrom is treated with the NF membrane, most of TAAH permeates through the NF membrane to enter the permeate, while a little, if any, photoresist permeates through the NF membrane to remain mostly in the concentrate wherein the photoresist is therefore concentrated. Further, a considerable amount of impurities such as some metal component including Fe and Al, and silica, which are hard to remove by ion exchange treatment, can be removed into the concentrate because they little permeate through the NF membrane. Accordingly, the permeate obtained only by separation treatment with the NF membrane may be used as such, for example, when the impurity concentration of the original development waste is low, or when the use of the rejuvenated developer is such that even a low purity thereof is tolerable.

When the rejuvenated developer is to be reused in the processes for production of electronic parts such as semiconductor devices, liquid crystal displays and printed boards, in which impurities must be avoided to an extreme extent, or the like processes, however, a high purity and/or high concentration of the rejuvenated developer is required, so that this permeate is usually subjected to a variety of refining and/or concentration step(s) at later stage. Nevertheless, use of the permeate stripped of most of impurities by separation treatment with the NF membrane can decrease the load of impurities in the later step(s) such for example as the ion exchange treatment, electrodialysis and/or electrolysis step to reduce the refining cost. Additionally stated, the step of separation treatment with the NF membrane is inexpensive and easy of operation.

When a large amount of TAA ions is still contained in the concentrate obtained by separation treatment with the NF membrane, a variety of refining step(s) for improving the TAA ion recovery may be taken at later stage(s), whereby the concentrate can be refined either to some degree of purification commensurate with the application of the rejuvenated developer or to such a high degree of purification that the rejuvenated developer can be reused in electronic part production processes and the like as the case may be.

Specifically, the permeate and/or the concentrate, preferably the permeate, which is obtained through the aforementioned step (A) according to the present invention, is desirably subjected to at least one step selected from the group consisting of an ion exchange treatment step (B) of removing impurities by adsorption thereof on an ion exchange resin(s) through contact therebetween (Japanese Patent Laid-Open No. 85,741/1998, and Japanese Patent Application No. 334,800/1997, incorporated herein by reference in their entirety), a concentration step (C) of obtaining a concentrate by at least one concentration method selected from the group consisting of reverse osmosis membrane treatment and evaporation, a concentration and refining step (D) of concentrating TAA ions by at least one method selected from the group consisting of electrodialysis and electrolysis, and a chromatographic separation step (E) of obtaining a TAA ion fraction by a chromatographic separation method (Japanese Patent Application No. 325,148/1997, incorporated herein by reference in its entirety). When a plurality of such steps are taken, the order thereof may be arbitrary, and any proper order thereof may be chosen, for example, in accordance with the purpose. Since the same as described in connection with the steps (d), (a) and (b) as pretreatments will apply to these steps (B), (C), (D) and (E), any redundant description thereof is omitted, provided that it should be noted that an anion exchange resin and/or a cation exchange resin in at least one of the H form and the TAA form is used in the step (B).

Since the permeate obtained by separation treatment with the NF membrane (hereinafter often referred to as the "NF permeate") is a TAAH solution having a considerably high purity, it may advantageously be passed as a concentrating liquid (liquid for recovery therein of TAAH) for electrodialysis or electrolysis through the concentrating cell(s) of an electrodialysis or electrolysis unit, while the concentrate obtained by separation treatment with the NF membrane (hereinafter often referred to as the "NF concentrate") may be passed as a starting solution (solution to be depleted of TAAH) for electrodialysis or electrolysis through the desalting cell(s) of the electrodialysis or electrolysis unit, if the NF concentrate contains a considerable amount of TAAH remaining therein. In this case, since the NF permeate is used instead of (ultra)pure water as the concentrating liquid, the amount of wastewater discharged as the desalted waste can advantageously be decreased. Further, the amount of TAAH transferred into the concentrating liquid by electrodialysis or electrolysis can advantageously be decreased to be able to reduce the running cost and miniaturize the unit.

For example, when a refining step(s) such as the ion exchange treatment, electrodialysis and/or electrolysis step is taken, it is preferred that such a step(s) be taken after the step of separation with the NF membrane rather than before that step from the standpoint of decreasing the load on a refining unit(s) for use in the refining step(s) because the purity of the NF permeate is considerably high. For example, in the case where the step of separation with the NF membrane is aimed at removing a small amount of impurities (particularly some metal component including Fe and Al, and silica, which are hard to remove by ion exchange treatment, and the like), however, the refining step(s) such as the ion exchange treatment, electrodialysis and/or electrolysis step may be taken before the step of separation with the NF membrane. Needless to say, such refining steps may optionally be taken before and after the step of separation with the NF membrane. In the case where the impurity concentration of the original development waste is low, in the case where the use of the rejuvenated developer is such that a low purity thereof is tolerable, or in the like case, TAA ions (preferably in the TAAH form in the NF permeate) may alternatively be concentrated by at least one of evaporation, reverse osmosis membrane treatment, electrodialysis and electrolysis after the step of separation with the NF membrane without ion exchange treatment, and/or adjustment of the TAAH concentration of the rejuvenated developer by addition thereto of a virgin conc. TAAH solution, or the like may alternatively be effected. More specifically speaking, whatever step or steps may fundamentally be taken as another step or as a plurality of other steps at any stage(s) as needed if only the step of separation with the NF membrane is taken. Thus, any necessary step(s) other than the step of separation with the NF membrane may be chosen while determining the order thereof in accordance with the purpose.

Examples of the anion exchange resin that may be used in the present invention include styrene, acrylic or like type anion exchange resins in a fibrous, granular or like form, which are preferred in an aspect of treatment efficiency, and which may be used either alone or in the form of a mixture or a stratified structure of a plurality thereof at an arbitrary proportion. As described before, however, styrene type anion exchange resins are especially preferred in an aspect of the photoresist removal efficiency. Additionally stated, acrylic type anion exchange resins are those obtained by crosslinking (meth)acrylic acid and an ester(s) thereof with divinylbenzene (DVB) or the like. Strongly basic anion exchange resins are preferred in an aspect of the photoresist removal efficiency, but weakly basic anion exchange resins also exert a photoresist-removing effect particularly on the neutral or acidic side. Thus, a plurality of strongly and weakly basic anion exchange resins may also be used in the form of either a mixture or a stratified structure at an arbitrary proportion. Although the counter ions of an anion exchange resin may be either OH–, or Cl– or the like, use of an anion exchange resin in the OH form, which has OH– ions as the counter ions, is preferred. This is so because use of an anion exchange resin in the Cl or like form, which has Cl– or like ions as the counter ions, results in conversion of at least part of the counter ions of TAA ions into Cl– or like ions. Additionally stated, when a weakly basic anion exchange resin is used on the neutral or acidic side, or when an anion exchange resin in the Cl or like form, which has Cl– or like ions as the counter ions, is used, electrolysis in a later step will suffice in order to turn TAA ions into the TAAH form.

Examples of the cation exchange resin in the H or TAA form that may be used in the present invention include styrene, acrylic or like type cation exchange resins in a fibrous, granular or like form, which are preferred in an aspect of treatment efficiency, and which may be either weakly acidic or strongly acidic. They may be used either alone or in the form of a mixture or a stratified structure of a plurality thereof at an arbitrary proportion.

Commercially available cation exchange resins are usually in the H form or in the sodium ion form (Na form). Such a cation exchange resin (preferably converted into the H form if originally in the Na form) may preliminarily be converted into the TAA form before service thereof to prevent occurrence of a phenomenon that TAAH is adsorbed on the cation exchange resin in the initial stage of solution passage through the cation exchange resin to lower the TAAH concentration of the resultant treated solution. More specifically, use of a cation exchange resin, after converted into the TAA form, is preferred though it can be used in the H form as it is. However, the cation exchange resin not completely in the TAA form but partially in the H form may also be used, or both of a cation exchange resin in the H form and a cation exchange resin in the TAA form may further alternatively be used in the form of either a mixture or a stratified structure at an arbitrary proportion.

Use of either the anion exchange resin or the cation exchange resin alternately treated with an aqueous alkali solution and an aqueous acid solution and then well washed with (ultra)pure water is preferred in order to make it free from any matter that may be leached out therefrom during the course of service thereof.

Which one of an anion exchange resin and a cation exchange resin, or both to use as the ion exchange resin may be determined based on the permissible amounts of various impurities such as the photoresist, other anions and cations that may be left in a TAAH solution to be rejuvenated in connection with a use of that solution. In the case where the rejuvenated TAAH solution is used as a developer for use in production of, for example, electronic parts such as semiconductor devices, liquid crystal displays and printed boards as described above, however, both of the anion exchange resin and the cation exchange resin are desirably used.

When both of an anion exchange resin and a cation exchange resin are used as the ion exchange resin, the anion exchange resin and the cation exchange resin may be mixed with each other and used in the form of a mixed ion exchange resin packed in a column or a tower, but are preferably used in the form of a stratified structure packed in a column or a tower, wherein the anion exchange resin is disposed on the upstream side of the cation exchange resin disposed on the downstream side. When the development waste is preliminarily subjected to a multi-stage electrodialysis treatment or the like to make the concentrate have the photoresist remaining little, or when the original development waste contains only a slight amount of the photoresist, however, the cation exchange resin may be disposed on the upstream side of the anion exchange resin disposed on the downstream side. Further, an upstream column or tower packed with the anion exchange resin may be disposed separately from but used in connection with a downstream column or tower packed with the cation exchange resin. In this case, only one of the anion and cation exchange resins, when lowered in ion exchange capacity or deteriorated through long-time service, can conveniently be easily replaced with the virgin one. In the foregoing cases of separate columns or towers, a nanofilter may be disposed between the column or tower packed with the anion exchange resin and the column or tower packed with the cation exchange resin.

Advantages involved in the case where the anion exchange resin is disposed on the upstream side of the cation exchange resin disposed on the downstream side are as follows: Since it is conceivable that a trace amount of an amine may be leached out from the anion exchange resin, this leached-out amine, if any, can be trapped on the cation exchange resin disposed on the downstream side. Further, since the photoresist as a polymeric substance has a fear that it may be adsorbed on the surfaces of the cation exchange resin to lower the cation exchange activity of the resin, the photoresist can advantageously be sufficiently removed beforehand by the anion exchange resin disposed on the upstream side.

A membrane treatment unit may further be provided at or near the terminal of the system involved in the process of the present invention. In this case, fine particles that exist in the development waste from the beginning (they may probably remain particularly in a solution obtained by a variety of treatment(s) of the NF concentrate), and fine particles that may be mixed therein from a nanofilter and pumps, and an electrodialysis unit and/or an electrolysis unit, an ion exchange resin, etc., if any, can favorably be removed for certain.

Examples of the membrane treatment unit include a microfiltration membrane unit wherein use is made of a polyethylene (PE), polypropylene (PP) or polytetrafluoroethylene (PTFE) membrane filter having micropores of 0.03 to 1 $\mu$m in diameter, and an ultrafiltration membrane unit. A suitable membrane treatment unit may be chosen and used in accordance with the purpose of treatment.

BRIEF DESCRIPTION OF THE DRAWINGS

The foregoing objects, features and advantages of the present invention will be better understood from the following description taken in connection with the accompanying drawings, in which.

PREFERRED MODES FOR CARRYING OUT THE INVENTION

The principle of electrodialysis that may be effected in the process of the present invention for treatment of development waste will now be described while referring to FIG. 1. Incidentally, the description will be made of an ordinary case where TAA ions have hydroxide ions (OH−, hereinafter referred to in brief as "OH ions") as the counter ions to be in the TAAH form.

Figure 1:
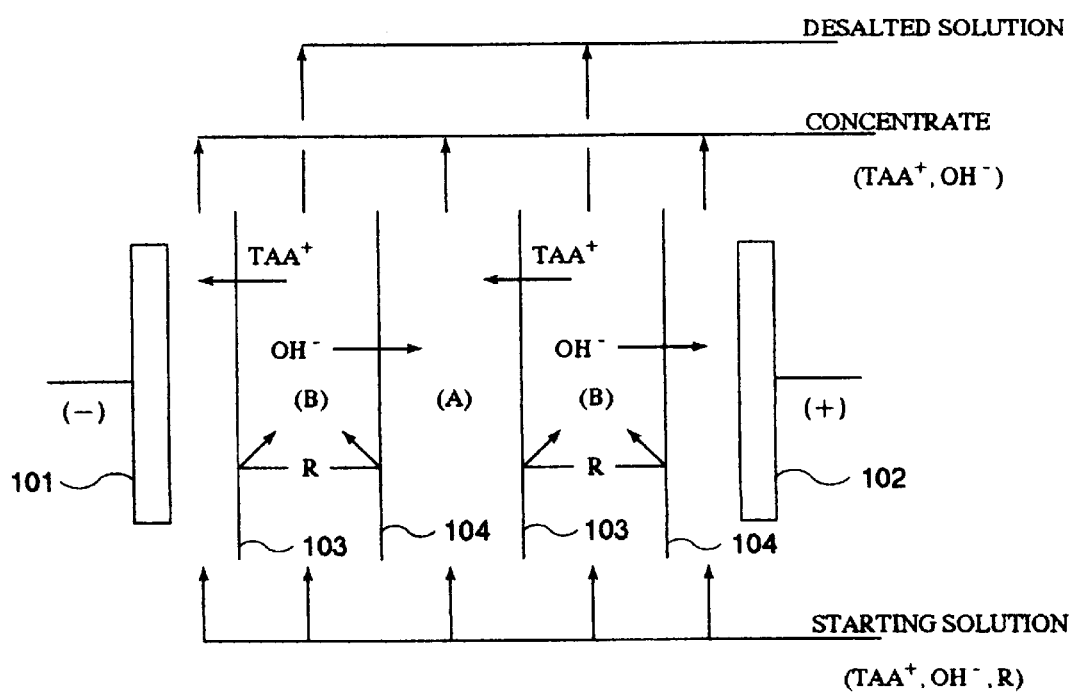
FIG. 1 is an illustration showing the principle of electrodialysis that may be carried out in the process of the present invention.

As shown in FIG. 1, cation exchange membranes 103 and anion exchange membranes 104 are arrayed alternately with each other between a cathode 101 and an anode 102 to form a plurality of cells. TAAH in a starting solution (development waste or treated solution derived therefrom, or optionally NF permeate or NF concentrate, or the like) containing TAAH and photoresist (R), and sent to the cells is dissociated into TAA ions (TAA+) as cations and OH ions as anions. When a DC electric current is applied between the cathode 101 and the anode 102, therefore, TAA ions are transferred toward the cathode across a cation exchange membrane 103 but substantially blocked by an anion exchange membrane 104 next thereto, while OH ions are transferred toward the anode across an anion exchange membranes 104 but substantially blocked by a cation exchange membrane 103 next thereto. Thus, TAAH is concentrated in a given cell, while TAAH is depleted in cells adjacent to that cell. More specifically, a cell (A) having an anion exchange membrane 104 facing the cathode 101 functions as a concentrating cell wherein TAAH is concentrated to form a concentrate, while a cell (B) having an anion exchange membrane 104 facing the anode 102 functions as a desalting cell wherein TAAH is depleted to form a desalted solution. Since the photoresist (R) in the starting solution hardly moves across the ion exchange membranes, the photoresist (R) is passed as such through every concentrating cell and every desalting cell to remain in the concentrate and the desalted solution.

As is apparent from the foregoing description, when the starting solution is passed through both the desalting cells and the concentrating cells as shown in FIG. 1, the photoresist (R) remains intact in the concentrate, and only TAAH is concentrated in the concentrating cells without concentration therein of the photoresist (R), whereby the photoresist concentration of the concentrate is almost the same as that of the starting solution. In this respect, electrodialysis is definitely different from evaporation and reverse osmosis wherein not only TAAH but also the photoresist is concentrated.

The present invention is aimed at regenerating and recovering a high-purity TAAH solution reutilizable as a photoresist alkali developer. In this respect, it is preferred to obtain a concentrate not substantially containing impurities such as the photoresist through electrodialysis. For that purpose, it is preferred that pure or ultrapure water or a solution of an electrolyte such as a low-concentration TAAH solution free of impurities such as the photoresist (e.g., a solution prepared by dissolving a small amount of virgin TAAH in pure or ultrapure water) be passed through the concentrating cells while passing the starting solution through the desalting cells. Where the starting solution (NF permeate in particular as described before) is passed through the concentrating cells as well, however, an advantage is gained in respect of a decrease in the amount (volume) of wastewater discharged as the desalted waste.

An electrodialysis unit may be one as is generally used. Examples of ion exchange membranes to be used in this unit, though not particularly limited in so far as capable of selectively separating either cations or anions, include ACIPLEX (registered trademark of products manufactured by Asahi Chemical Industry Co., Ltd.), SELEMION (registered trademark of products manufactured by Asahi Glass Co., Ltd.), NEOSEPTA (registered trademark of products manufactured by Tokuyama Soda Co., Ltd.), IonClad (registered trademark) electrically driven separation membranes (manufactured by Pall Company), and Nafion (registered trademark of products manufactured by E. I. du Pont de Nemours and Company). Properties of ion exchange membranes may be typical, which include, for example, a thickness of about 0.1 to 0.6 mm and an electric resistance of about 1 to 10 $\Omega.cm^2$.

The structure of the electrodialysis unit is not particularly limited. For example, a plurality of cation exchange membranes and a plurality of anion exchange membranes may be stacked alternately with each other while maintaining appropriate intervals therebetween with gaskets provided either with an inflow port and an outflow port for a desalting solution, or with an inflow port and an outflow port for a concentrating liquid to form a plurality of cells, which are interposed between a pair of electrodes to construct an electrodialysis unit.

Herein, neutral membranes made of polyvinyl alcohol or the like and having a superior alkali resistance to that of anion exchange membranes may be used instead of the anion exchange membranes. The neutral membranes, which are simple polymer membranes free of ionic functional groups, allow TAA ions to be passed thereacross, but are lower in permeability thereto than cation exchange membranes. In this case, therefore, a difference in transference number between the neutral membranes and the cation exchange membranes is taken advantage of, whereby TAA ions can be concentrated by electrodialysis. When the neutral membranes are used instead of the anion exchange membranes, however, the current efficiency becomes worse than that in the case of the anion exchange membranes.

Examples of electrodialysis processes, which may be done either batch-wise or continuously, include not only a single-stage method, but also a circulation method and a multi-stage treatment method as disclosed in Japanese Patent Laid-Open No. 328,642/1995 (incorporated herein by reference in its entirety).

The principle of electrolysis that may be effected in the process of the present invention for treatment of development waste will now be described while referring to FIG. 2. Incidentally, the description will be made of an ordinary case where TAA ions have OH ions as the counter ions thereof to be in the TAAH form.

Figure 2:
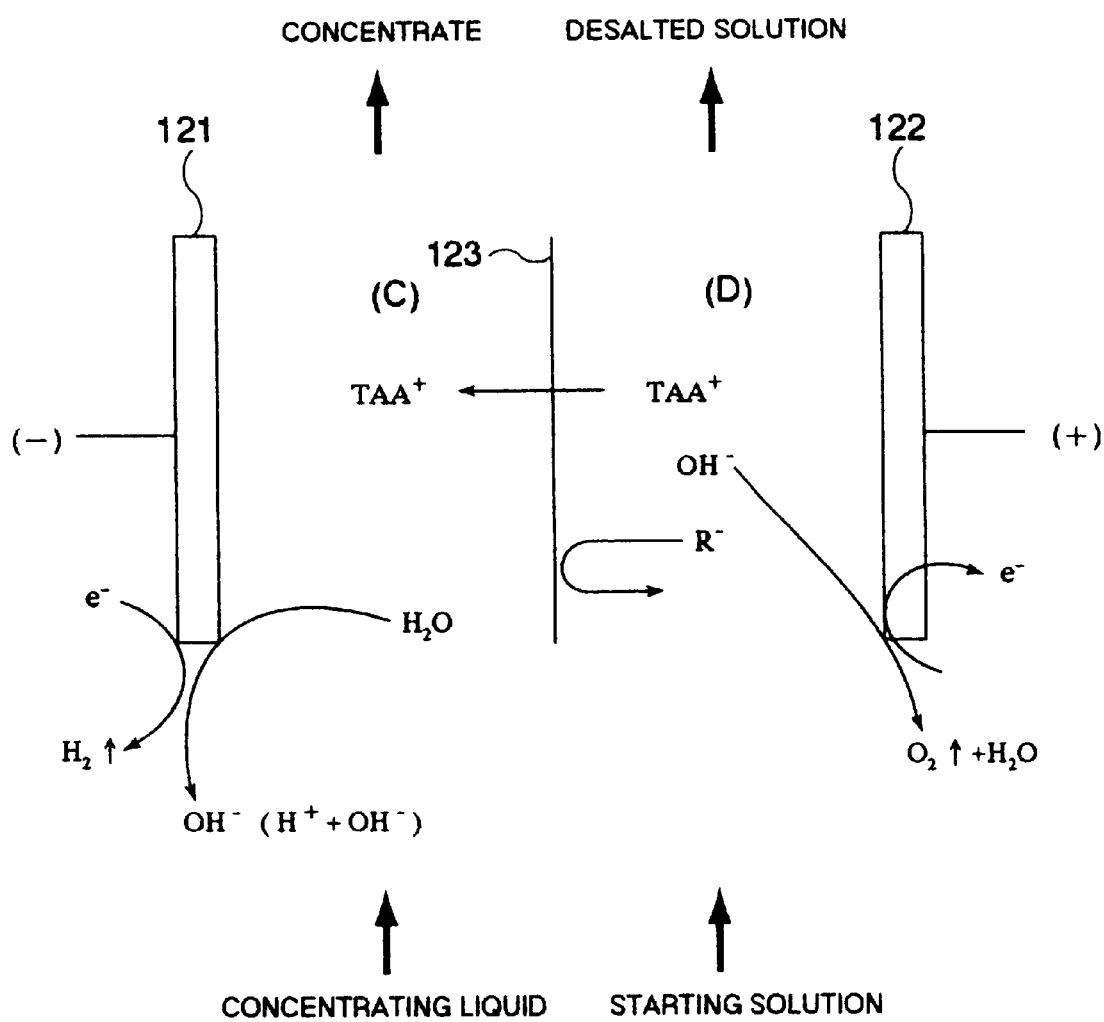
FIG. 2 is an illustration showing the principle of electrolysis that may be carried out in the process of the present invention.

As shown in FIG. 2, a cation exchange membrane 123 is disposed between a cathode 121 and an anode 122 to form a cathode cell (C) and an anode cell (D). In principle, the cation exchange membrane allows only cations to be passed thereacross [actually, however, a slight amount of anions including photoresist (R−) and the like is passed thereacross]. A starting solution (development waste or treated solution derived therefrom, or optionally NF permeate or NF concentrate, or the like) is passed through the anode cell (D), while pure or ultrapure water, a solution of an electrolyte such as a low-concentration TAAH solution free of impurities such as the photoresist (e.g., a solution prepared by dissolving a small amount of virgin TAAH in pure or ultrapure water), or the like is passed as a concentrating liquid through the cathode cell (C). Since TAAH in the starting solution is dissociated into TAA ions (TAA+) and OH ions (OH−), TAA ions as cations are transferred toward the cathode (−) to enter the cathode cell (C) across the cation exchange membrane 123 when a DC electric current is applied between the cathode 121 and the anode 122. On the cathode 121, hydrogen ions ($H^+$) from water ($H_2O \leftarrow \rightarrow H^+ + OH^-$) receive electrons ($e^-$) to generate hydrogen gas ($H_2$), while residual OH ions ($OH^-$) as anions become counter ions of TAA ions entering the cathode cell (C) from the anode cell (D), whereby TAAH is formed. Thus, TAAH is concentrated in the cathode cell (C) in keeping with progress of electrolysis. In this sense, the cathode cell (C) functions as a concentrating cell. On the other hand, on the anode 122, OH ions ($OH^-$) of TAAH release electrons ($e^-$) to become oxygen gas ($O_2$) and water. In this sense, the anode cell (D) functions as a desalting cell wherein a desalted solution ("dilute solution" depleted of TAA ions) is formed.

Additionally stated, if ionic species such as Cl– or Br–, which is more liable to undergo electrolysis, is contained in the starting solution, a gas such as $Cl_2$ or $Br_2$ is generated. In this case, further division of the anode cell with an anion exchange membrane with addition of an alkaline substance such as ammonium hydroxide to a sectional cell on the anode's side can prevent generation of a gas such as $Cl_2$ or $Br_2$ through neutralization as disclosed in Japanese Patent Laid-Open No. 155,390/1982 (incorporated herein by reference in its entirety). On the other hand, $SO_4^{2-}$ and $NO_3^-$ less easily undergo electrolysis than OH—, so that they remain in the form of $H_2SO_4$, $HNO_3$, etc. with electrolysis of OH– involving generation of $O_2$.

Two neutral membranes such as hydrophilized porous Teflon membranes may alternatively be used instead of the cation exchange membrane to provide an anode chamber, a middle chamber and a cathode chamber, wherein electrolysis can be effected by passing the starting solution through the middle chamber (Japanese Patent Laid-Open No. 247,641/1985, incorporated herein by reference in its entirety).

When a higher-purity TAAH concentrate is desired to be obtained, a plurality of (preferably two) cation exchange membranes may be disposed between the cathode and the anode. In this case, the starting solution is passed through a cell on the anode's side (anode cell), while a concentrating liquid (liquid for recovery therein of TAAH) such for example as pure or ultrapure water or a solution of an electrolyte such as a low-concentration TAAH solution free of impurities such as the photoresist (e.g., a solution prepared by dissolving a small amount of virgin TAAH in pure or ultrapure water) is passed through a cell on the cathode's side (cathode cell) and the middle cell, whereby TAAH can be refined in multiple stages to obtain a high-purity TAAH concentrate from the cathode cell.

Examples of electrolysis processes, which may be done either batch-wise or continuously, include not only a single-stage method, but also a circulation method and a multi-stage treatment method as described before in connection with electrodialysis.

Additionally stated, the terms "concentrate" and "desalted solution" used herein are used to indicate whether the TAAH content is increased or decreased, and not to indicate which is higher or lower in TAAH concentration.

Modes for carrying out the present invention include the following preferred embodiments, which should not be construed as limiting the scope of the present invention.

Figure 3:
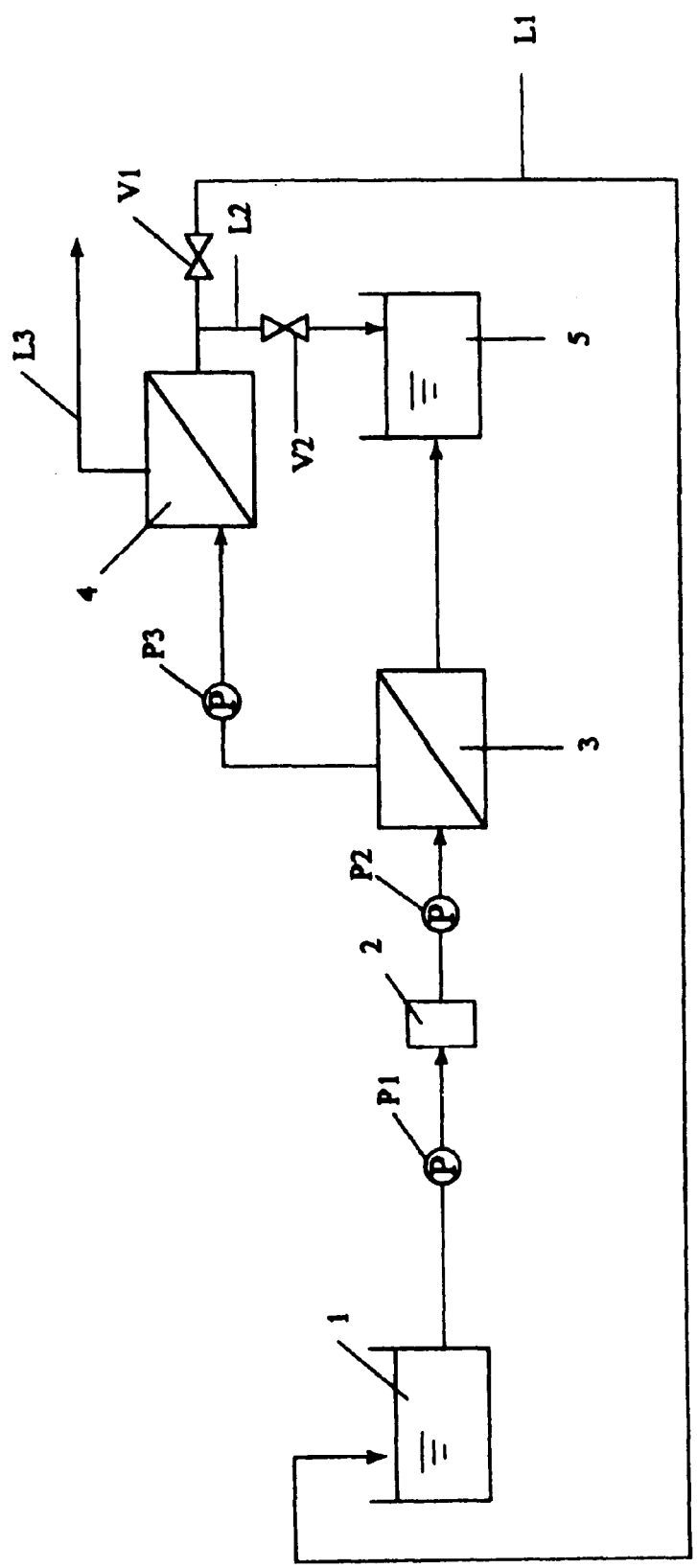
FIG. 3 is a flow diagram illustrating an example of equipment (system) for use in the NF membrane separation step carried out according to a two-stage method in the process of the present invention.
Figure 4:
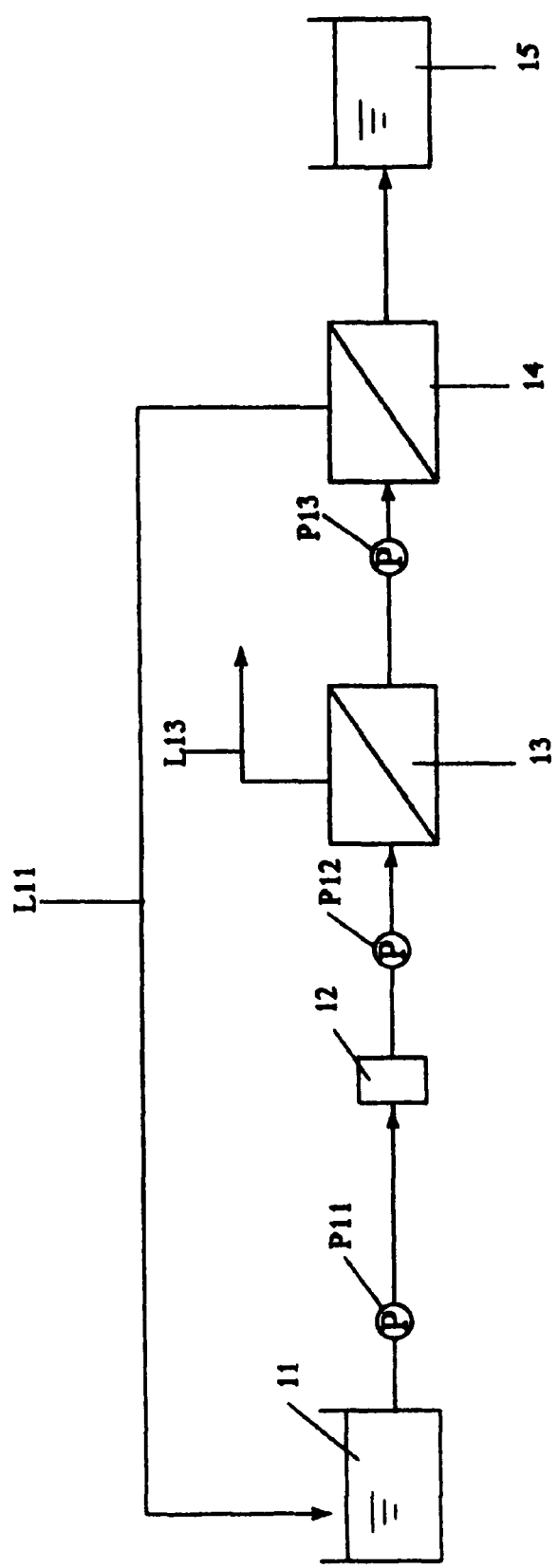
FIG. 4 is a flow diagram illustrating another example of equipment (system) for use in the NF membrane separation step carried out according to a two-stage method in the process of the present invention.
Figure 5:
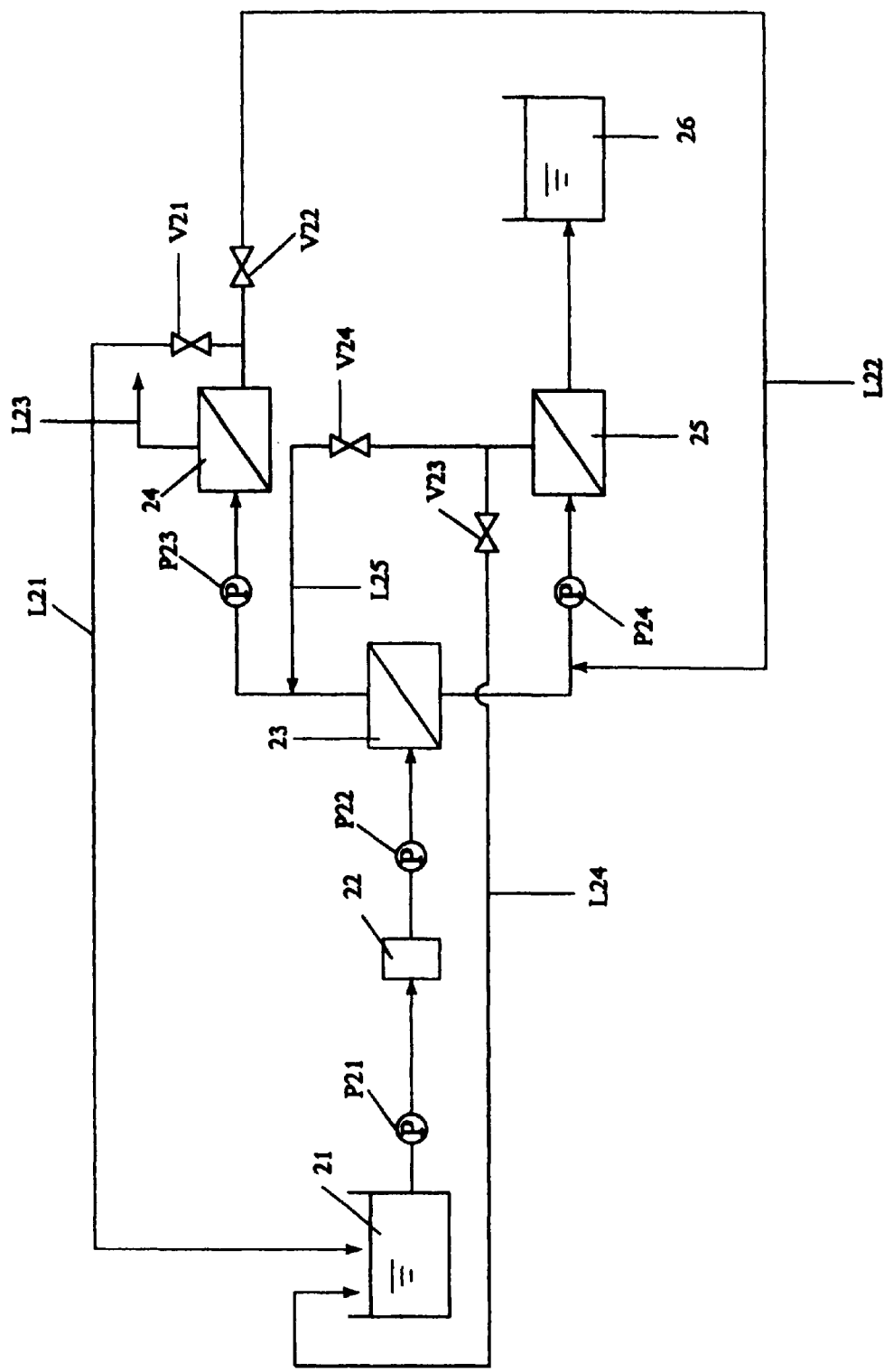
FIG. 5 is a flow diagram illustrating an example of equipment (system) for use in the NF membrane separation step carried out in combination of a two-stage method as shown in FIG. 3 with a two-stage method as shown in FIG. 4.

The NF membrane separation step taken in the process of the present invention for rejuvenation treatment of the development waste may be effected in one stage, but can advantageously be effected in multiple stages to improve the TAAH recovery and/or the degree of TAAH purification. Taking simple cases as examples of the latter case, two-stage NF membrane separation will be described while referring to FIGS. 3 to 5 illustrating examples of equipment (system) for use therein. Incidentally, the description will be made of ordinary cases where a starting waste containing TAA ions mainly in the TAAH form (development waste or treated solution derived therefrom) is subjected to the NF membrane separation step.

[1] Two-stage Mode for Securing High Recovery (see FIG. 3)

The starting waste is passed from a starting waste tank 1 via a pump P1 through a safety filter 2 and then sent via a pump P2 to a first nanofilter 3, wherein the waste is separated with an NF membrane into an NF concentrate containing impurities such as the photoresist concentrated therein and an NF permeate mainly containing TAAH. The NF concentrate is sent via a pump P3 to a second nanofilter 4, while the NF permeate is sent to an NF permeate tank 5.

The NF concentrate is subjected to separation treatment with an NF membrane in the second nanofilter 4 further to recover TAAH remaining in the NF concentrate into an NF permeate, which may then be returned back and mixed with the starting waste via an NF permeate line L1. On the other hand, an NF concentrate obtained from the second nanofilter 4 may be discharged, for example, as wastewater out of the system via a blow line L3. When the TAAH purity of the NF permeate obtained from the second nanofilter 4 is comparatively high, at least part of it may be sent via an NF permeate line L2 to an NF permeate tank 5 to be combined with the NF permeate obtained from the first nanofilter 3. Whether the NF permeate obtained from the second nanofilter 4 is to be returned back to the starting waste or at least partly to be combined with the NF permeate obtained from the first nanofilter 3 should be determined having regard to the purity and the like thereof, whereby the flow of the NF permeate is controlled by valves V1 and V2. The NF permeate in the NF permeate tank 5 may be either optionally used intact as a rejuvenated developer though it depends on a use thereof, or further stripped of impurities, for example, with an electrodialysis unit and/or an ion exchange treatment unit (e.g., a mixed bed or a stratified structure of an anion exchange resin and a cation exchange resin in the TAA form, or the like) not shown in the figure to recover a refined solution, which may be further treated with a membrane treatment unit not shown in the figure, if necessary, to remove fine particles for recovery of a high-purity TAAH solution as a rejuvenated developer.

[2] Two-Stage Mode for Securing High Degree of Purification (see FIG. 4)

The starting waste is passed from a starting waste tank 11 via a pump P11 through a safety filter 12, and then sent via a pump P12 to a first nanofilter 13, wherein it is separated with an NF membrane into an NF concentrate containing impurities such as the photoresist concentrated therein and an NF permeate mainly containing TAAH. The NF concentrate may be discharged, for example, as wastewater out of the system via a blow line L13. On the other hand, the NF permeate is sent via a pump P13 to a second nanofilter 14, wherein it is separated with an NF membrane into an NF concentrate containing impurities such as the residual photoresist concentrated therein and a further refined NF permeate mainly containing TAAH. Since this NF concentrate is comparatively clean, it may be returned back and mixed with the starting waste via an NF concentrate line L11. On the other hand, the NF permeate obtained from the second nanofilter 14 is sent to an NF permeate tank 15. How to deal with the NF permeate in the NF permeate tank 15 is substantially the same as described in connection with the two-stage mode [1].

[3] Combined Mode of Foregoing Two Modes (see FIG. 5)

A starting waste tank 21, a pump P21, a safety filter 22, a pump P22, a first nanofilter 23, a pump P23, a second nanofilter 24, NF permeate lines L21 and L22, valves V21 and V22, and a blow line L23 constitute substantially the same system as in the foregoing two-stage mode [1] (see FIG. 3). On the other hand, the starting waste tank 21, the pump P21, the safety filter 22, the pump P22, the first nanofilter 23, a pump P24, a third nanofilter 25, an NF concentrate line L24, and an NF permeate tank 26 constitute substantially the same system as in the foregoing two-stage mode [2] (see FIG. 4), provided that this system shown in FIG. 5 is different from the system of the mode [2] shown in FIG. 4 in that the NF concentrate obtained from the first nanofilter 23 is, sent to the second nanofilter 24 in FIG. 5 whereas the NF concentrate obtained from the first nanofilter 13 is discharged out of the system via the blow line L13 in FIG. 4, and in that the NF concentrate line branched into lines L24 and L25 in FIG. 5 is used instead of the NF concentrate line L11 in FIG. 4, so that the NF concentrate obtained from the third nanofilter 25 may be combined either via the NP concentrate line L24 with the starting waste or via the NF concentrate line L25 with the NF concentrate obtained from the first nanofilter 23 to enable it to be sent to the second nanofilter 24. Whether the NF concentrate obtained from the third nanofilter 25 is to be returned back to the starting waste or at least partly to be combined with the NF concentrate obtained from the first nanofilter 23 should be determined having regard to the purity and the like thereof, whereby the flow of the NF permeate is controlled by valves V23 and V24. How to deal with the NF permeate in the NF permeate tank 26 is substantially the same as described in connection with the two-stage mode [1].

Such multi-stage modes may of course be constituted in the form of a three- or more-stage mode after the two-stage mode [1] or [2].

Figure 6:
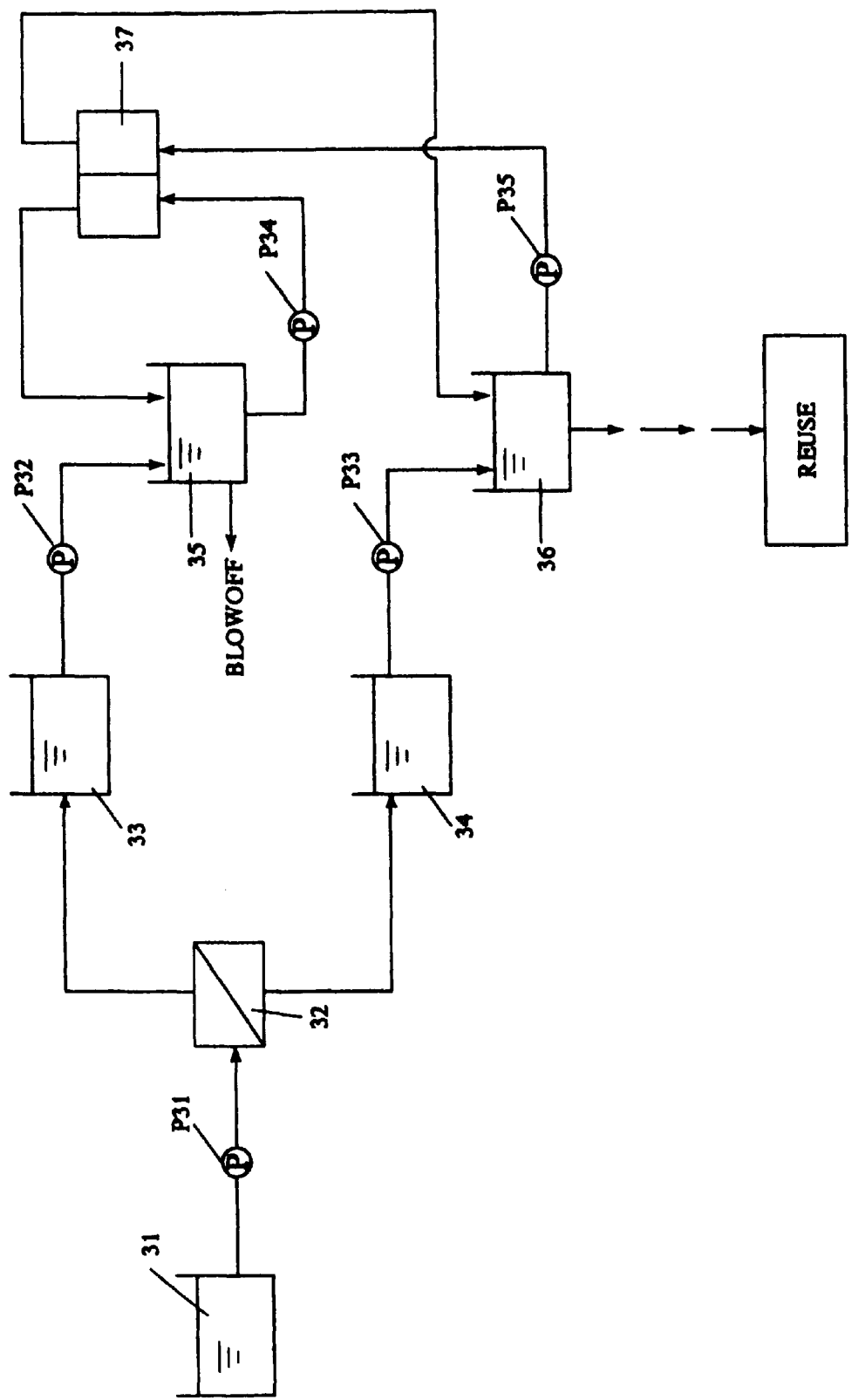
FIG. 6 is a flow diagram illustrating an example of equipment (system) including a nanofilter and a circulation type electrodialysis unit in combination, which equipment may favorably be used in the process of the present invention.

An example of the process of the present invention in which a nanofilter is used in combination with a circulation type electrodialysis unit will be described while referring to FIG. 6 showing an example of equipment (system) for use in that example. Incidentally, the description will be made of an ordinary case where a starting waste (development waste or treated solution derived therefrom) containing TAA ions mainly in the TAAH form is treated.

The starting waste is sent from a starting waste tank 31 via a pump P31 to a nanofilter 32 (a safety filter is desired to be disposed in front of the nanofilter 32 as described before), wherein it is separated with an NF membrane into an NF concentrate containing impurities such as the photoresist concentrated therein and an NF permeate mainly containing TAAH. The NF concentrate is sent to an NF concentrate tank 33, while the NF permeate is sent to an NF permeate tank 34. The NF concentrate is then sent from the NF concentrate tank 33 via a pump P32 to a desalted solution tank 35 for an electrodialysis unit 37, while the NF permeate is then sent from the NF permeate tank 34 via a pump P33 to a concentrate tank 36 for the electrodialysis unit 37.

The NF permeate is sent as the concentrating liquid (liquid for recovery therein of TAAH) from the concentrate tank 36 via a pump P35 to the concentrating cells of the electrodialysis unit 37, while the NF concentrate is sent as the starting solution (solution to be desalted) from the desalted solution tank 35 via a pump P34 to the desalting cells of the electrodialysis unit 37. The concentrate outflowing from the concentrating cells of the electrodialysis unit 37 is returned back to the concentrate tank 36, while the desalted solution outflowing from the desalting cells of the electrodialysis unit 37 is returned back to the desalted solution tank 35, whereby electrodialysis is effected according to a circulation method. The desalted solution which has become thin in TAAH is blown off as wastewater from the desalted solution tank 35. On the other hand, the concentrate containing TAAH concentrated therein may be sent, if necessary, from the concentrate tank 36 to an ion exchange treatment unit (e.g., in the form of a mixed bed or a stratified structure of an anion exchange resin and a cation exchange resin in the TAA form, or the like) not shown in the figure, wherein it is subjected to ion exchange treatment to remove impurities and recover a refined solution, which may be further treated, if necessary, with a membrane treatment unit not shown in the figure to remove fine particles and recover a high-purity TAAH solution as a rejuvenated developer.

The pumps P32 and P33 are stopped once predetermined amounts of the NF concentrate and the NF permeate are stored in the desalted solution tank 35 and the concentrate tank 36, respectively. The electrodialysis unit 37 is run according to a circulation method until predetermined TAAH purity and concentration are secured, and is then stopped. The concentrate obtained by electrodialysis (hereinafter often referred to as the "ED concentrate") may be either sent to any next step or reutilized, while the desalted solution is blown off. Thereafter, the predetermined amounts of the NF concentrate and the NF permeate are sent to the desalted solution tank 35 and the concentrate tank 36, respectively, followed by starting the running of the electrodialysis unit 37. The foregoing procedure is repeated. Alternatively, there may be adopted a method wherein the system of FIG. 6 is run in such a way that the mixture of the NF permeate inflowing into the concentrate tank 36 and the ED concentrate can maintain predetermined TAAH purity and concentration, whereby blowoff of the desalted solution and recovery of the rejuvenated developer can be continuously done.

Incidentally, a multi-stage type electrodialysis unit may be used instead of the circulation type one, and a plurality of nanofilters may be used according to a multi-stage mode as described before. The foregoing method and equipment can be applied in substantially the same manner to a case where a nanofilter is used in combination with an electrolysis unit.

Figure 7:
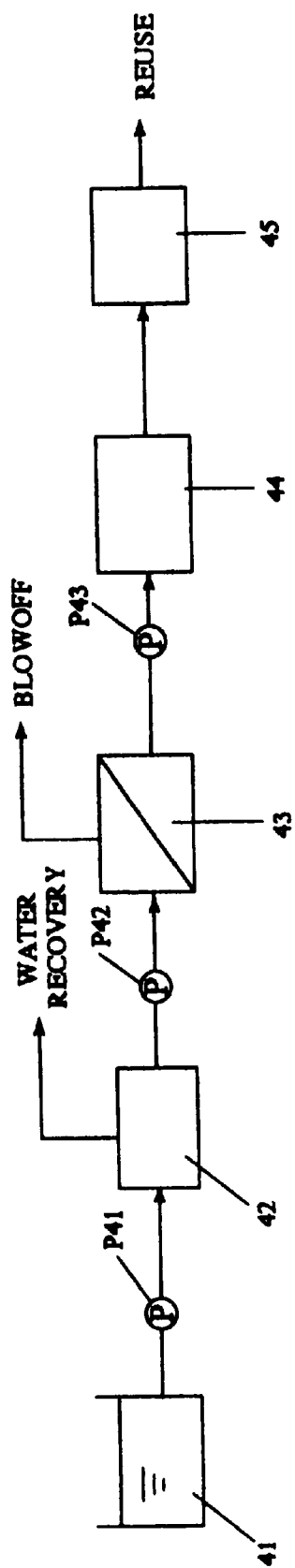
FIG. 7 is a flow diagram illustrating an example of equipment (system) including an evaporation or reverse osmosis membrane treatment unit, a nanofilter, and an ion exchange treatment unit in combination, which equipment may favorably be used in the process of the present invention.

An example of the process of the present invention in which an evaporation or reverse osmosis membrane treatment unit and at least one nanofilter are used in combination with an ion exchange treatment unit will now be described while referring to FIG. 7 showing an example of equipment (system) for use in that example. Incidentally, the description will be made of an ordinary case where a starting waste (development waste or treated solution derived therefrom) containing TAA ions mainly in the TAAH form is treated.

The starting waste is sent from a starting waste tank 41 via a pump P41 to an evaporation or reverse osmosis membrane treatment unit 42, wherein it is concentrated. Herein, the condensate in the case of an evaporation unit or the permeate in the case of a reverse osmosis membrane treatment unit may be recovered as process water or the like. On the other hand, the concentrate is sent to at least one nanofilter 43 (which may be of a multiple stage mode as described before), from which the concentrate containing impurities such as the photoresist concentrated therein is blown off as wastewater, and the permeate decreased in the amount of the above-mentioned impurities is sent via a pump P43 to an ion exchange treatment unit 44 (e.g., in the form of a mixed bed or a stratified structure of an anion exchange resin and a cation exchange resin in the TAA form, or the like). The resultant ion-exchanged solution is preferably stripped of impurities such as fine particles with a membrane treatment unit 45, and then reutilized.

In equipment (system) for carrying out the process of the present invention, examples of which include the foregoing variety of equipment (systems), water tanks provided if necessary and aimed at storing or staying any solutions containing at least TAA ions are preferably constructed in such a way that they are purged with an inert gas such as nitrogen gas or argon gas (Japanese Patent Laid-Open No. 165,933/1998, incorporated herein by reference in its entirety). In this case, the water tanks are more preferably constructed in such a way that the inert gas pressure therein can be maintained higher than the atmospheric pressure, and especially preferably constructed in such a way that a water-sealing unit is attached to each of the water tanks purged with the inert gas. This prevents strongly alkaline TAAH (TAA$^+$OH$^-$) from being converted into a tetraalkylammonium hydrogencarbonate (TAA$^+$HCO$_3^-$) and/or a tetraalkylammonium carbonate [(TAA$^+$)$_2$CO$_3^{2-}$] due otherwise to dissolution of carbon dioxide gas (CO$_2$) in the atmosphere into a solution containing TAA ions through contact therebetween, and prevents other impurities in the atmosphere (various gases such as acidic gases other than CO$_2$ and oxidizing gases, dust, dirt, metals, salts, etc.) from being mixed in that solution. This is particularly required when the rejuvenated developer is to be used as a developer for use in production of electronic parts such as semiconductor devices.

If necessary, an analytical controller(s) including a quantitative determination unit for the photoresist concentration of the development waste and/or a variety of treated solution thereof (e.g., an absorption spectrometer, an absorptiometer, or the like), and, if necessary, a quantitative determination unit for the TAAH concentration thereof (e.g., a pH-metric titrating apparatus, a potentiometric titrating apparatus, a conductivity meter, an ultrasonic concentration meter, or the like) may favorably be provided at a suitable position(s) in equipment (system) for carrying out the process of the present invention (Japanese Patent Laid-Open No. 207,082/1998, incorporated herein by reference in its entirety). If further necessary, a temperature controller(s) having at least a cooling function may be provided at a suitable position(s), while a TAAH concentration controller may favorably be provided around the terminal of the system to enable the resultant rejuvenated developer to be fed directly to a development unit [Japanese Patent Application No. 9-309583 (i.e., 309,583/1997), incorporated herein by reference in its entirety once laid open although it has not yet been published].

In addition to the NF membrane separation step, the process of the present invention may favorably further comprise a variety of step(s) such as a step of concentration by at least one concentration method of reverse osmosis membrane treatment, evaporation, electrodialysis and electrolysis, and/or a step of ion exchange treatment with an anion exchange resin and/or a cation exchange resin in at least one of the H form and the TAA form as already described in order to obtain a high-purity TAAH solution having a desirable TAAH concentration. There will now be mentioned examples of the preferred order (flow) of a series of unit operations in the case of making a start from the development waste, which should not be construed as limiting the scope of the present invention. Additionally stated, the indication "/" stands for "and/or," and the simple term "ion exchange treatment" indicates treatment with an anion exchange resin or a cation exchange resin, or both ("mixed bed," or a stratified structure or separate columns wherein they are preferably disposed in the order of "anion exchange resin→cation exchange resin"). Further, "membrane treatment" with a membrane treatment unit for removal of fine particles as described above, which is not an indispensable unit operation, is preferably effected at the last stage though not particularly mentioned in the following flows other than flows wherein NF membrane separation is effected at the last stage. A nanofilter may be used instead of the above-mentioned membrane treatment unit in the last-stage membrane treatment.

(1) NF membrane separation→evaporation/reverse osmosis membrane treatment/electrodialysis/electrolysis.

(2) NF membrane separation→ion exchange treatment.

(3) NF membrane separation→evaporation/reverse osmosis membrane treatment/electrodialysis/electrolysis→ion exchange treatment.

(4) NF membrane separation→ion exchange treatment→evaporation/reverse osmosis membrane treatment/electrodialysis/electrolysis.

(5) NF membrane separation→evaporation/reverse osmosis membrane treatment→ion exchange treatment→electrodialysis/electrolysis.

(6) NF membrane separation→evaporation/reverse osmosis membrane treatment→anion exchange treatment→electrodialysis/electrolysis→cation exchange treatment.

(7) NF membrane separation→evaporation/reverse osmosis membrane treatment→anion exchange treatment→electrodialysis/electrolysis→ion exchange treatment.

(8) evaporation/reverse osmosis membrane treatment/electrodialysis/electrolysis→NF membrane separation.

(9) evaporation/reverse osmosis membrane treatment/electrodialysis/electrolysis→NF membrane separation→ion exchange treatment.

(10) evaporation/reverse osmosis membrane treatment/electrodialysis/electrolysis→ion exchange treatment→NF membrane separation.

(11) evaporation/reverse osmosis membrane treatment→NF membrane separation→electrodialysis/electrolysis→ion exchange treatment.

(12) evaporation/reverse osmosis membrane treatment→NF membrane separation→ion exchange treatment→electrodialysis/electrolysis.

(13) evaporation/reverse osmosis membrane treatment→NF membrane separation→anion exchange treatment→electrodialysis/electrolysis→cation exchange treatment.

(14) evaporation/reverse osmosis membrane treatment→NF membrane separation→anion exchange treatment→electrodialysis/electrolysis→ion exchange treatment.

(15) neutralization+solid-liquid separation→NF membrane separation→electrolysis.

(16) neutralization+solid-liquid separation→NF membrane separation→electrolysis→ion exchange treatment.

(17) neutralization+solid-liquid separation→electrolysis→NF membrane separation.

(18) neutralization+solid-liquid separation→electrolysis→NF membrane separation→ion exchange treatment.

(19) neutralization+solid-liquid separation→electrolysis→ion exchange treatment→NF membrane separation.

(20) neutralization+solid-liquid separation→evaporation/ reverse osmosis membrane treatment→NF membrane separation→electrolysis.

(21) neutralization+solid-liquid separation→evaporation/ reverse osmosis membrane treatment→NF membrane separation→electrolysis→ion exchange treatment.

(22) neutralization+solid-liquid separation→evaporation/ reverse osmosis membrane treatment→electrolysis→NF membrane separation.

(23) neutralization+solid-liquid separation→evaporation/ reverse osmosis membrane treatment→electrolysis→NF membrane separation→ion exchange treatment.

(24) neutralization+solid-liquid separation→evaporation/ reverse osmosis membrane treatment→electrolysis→ion exchange treatment→NF membrane separation.

(25) evaporation/reverse osmosis membrane treatment→neutralization+solid-liquid separation→NF membrane separation→electrolysis.

(26) evaporation/reverse osmosis membrane treatment→neutralization+solid-liquid separation→NF membrane separation→electrolysis→ion exchange treatment.

(27) evaporation/reverse osmosis membrane treatment→neutralization+solid-liquid separation→electrolysis→NF membrane separation.

(28) evaporation/reverse osmosis membrane treatment→neutralization+solid-liquid separation→electrolysis→NF membrane separation→ion exchange treatment.

(29) evaporation/reverse osmosis membrane treatment→neutralization+solid-liquid separation→electrolysis→ion exchange treatment→NF membrane separation.

(30) chromatographic separation→NF membrane separation.

(31) chromatographic separation→NF membrane separation→ion exchange treatment.

(32) chromatographic separation→ion exchange treatment→NF membrane separation.

(33) evaporation/reverse osmosis membrane treatment→chromatographic separation→NF membrane separation.

(34) evaporation/reverse osmosis membrane treatment→chromatographic separation→NF membrane separation→ion exchange treatment.

(35) evaporation/reverse osmosis membrane treatment→chromatographic separation→ion exchange treatment→NF membrane separation.

EXAMPLES

The following Examples will specifically illustrate the present invention, but should not be construed as limiting the scope of the present invention.

Example 1

Each of the following sample solutions was passed as the starting waste through a nanofilter including an NF membrane to effect NF membrane separation treatment thereof at a recovery (amount of NF permeate/amount of starting waste) of 33%. NTR-7450 manufactured by NITTO DENKO CORPORATION was used as the NF membrane. The pressure at the inlet of the nanofilter was set to be 10 kgf/cm$^2$.

(1) Sample Solution 1: development waste discharged from LCD production process in Company A (2) Sample Solution 2: concentrate (bottoms) obtained by evaporation of development waste discharged from semiconductor device production process in Company B The results of analyses of NF permeates are shown together with the results of analyses of the starting wastes in Table 1. Additionally stated, the TMAH concentration was analyzed according to ion-exchange chromatography, the photoresist-derived TOC concentration was measured according to absorption spectrophotometry, the metal ion concentrations were measured according to atomic absorption spectrometry, and the silica ($SiO_2$) concentration was measured by the molybdenum blue method (JIS K0101). In the following Tables, "Resist" stands for the photoresist-derived TOC concentration.

TABLE 1

|  | Sample Solution 1 | | Sample Solution 2 | |
| --- | --- | --- | --- | --- |
|  | Starting Waste | NF Permeate | Starting Waste | NF Permeate |
| TMAH (wt. %) | 0.8 | 0.7 | 29.2 | 29.0 |
| Resist (ppm) | 477 | 28 | 3100 | 1280 |
| Na (ppb) | 1730 | 1120 | 1670 | 1650 |
| Fe (ppb) | 84 | 29 | 1650 | 1020 |
| Al (ppb) | 2210 | 260 | 570 | 340 |
| SiO$_2$ (ppm) | 2.6 | 0.4 | 24.5 | 3.7 |

Example 2

The NF permeate of Sample Solution 1 in Example 1 was passed as the starting solution through the desalting cells of an electrodialysis unit MICRO ACILYZER (registered trademark) G3 (manufactured by Asahi Chemical Industry Co., Ltd.), while ultrapure water (concentrating liquid) was initially passed through the concentrating cells of that unit. Electrodialysis was continued according to a circulation method until the TMAH concentration of the solution of TMAH recovered into ultrapure water (concentrating liquid) reached 2.4 wt. % at a TMAH recovery of 80%. In this electrodialysis unit, use was made of neutral membranes ACIPLEX (registered trademark) PVA #100 (manufactured by Asahi Chemical Industry Co., Ltd.) and cation exchange membranes ACIPLEX K-501 (manufactured by Asahi Chemical Industry Co., Ltd.). The ED concentrate obtained by this electrodialysis was subjected to ion exchange treatment to obtain an ion-exchanged solution (hereinafter referred to as an "IE-treated solution"). In this ion exchange treatment, use was made of a column packed in a mixed bed form with a strongly basic anion exchange resin AMBERLITE (registered trademark) IRA-900 (manufactured by Rohm and Haas Company) in the OH form and a cation exchange resin AMBERLITE 200C (manufactured by Rohm and Haas Company) preliminarily converted into the tetramethylammonium ion form (TMA form) by washing it with a virgin aqueous TMAH solution. The results of analyses of the ED concentrate and the IE-treated solution are shown in Table 2, which also includes data listed in Table 1. Additionally stated, the analytical methods were the same as in Example 1.

TABLE 2

| Sample Solution 1 | Starting Waste | NF Permeate | ED Concentrate | IE-treated Solution |
|---|---|---|---|---|
| TMAH (wt. %) | 0.8 | 0.7 | 2.4 | 2.4 |
| Resist (ppm) | 477 | 28 | 1.2 | <0.1 |
| Na (ppb) | 1730 | 1120 | 3950 | <10 |
| Fe (ppb) | 84 | 29 | 11 | <10 |
| Al (ppb) | 2210 | 260 | 19 | <10 |
| $SiO_2$ (ppm) | 2.6 | 0.4 | 0.3 | <0.2 |

Example 3

Electrodialysis was carried out using the NF permeate of Sample Solution 2 in Example 1 as the starting solution in the same manner as in Example 2 until the TMAH concentration of the solution of TMAH recovered into ultrapure water (concentrating liquid) reached 2.4 wt. % at a TMAH recovery of 80%. The ED concentrate obtained by this electrodialysis was then subjected to substantially the same ion exchange treatment as in Example 2 to obtain an IE-treated solution. The results of analyses of the ED concentrate and the IE-treated solution are shown in Table 3, which also includes data listed in Table 1. Additionally stated, the analytical methods were the same as in Example 1.

TABLE 3

| Sample Solution 2 | Starting Waste | NF Permeate | ED Concentrate | IE-treated Solution |
|---|---|---|---|---|
| TMAH (wt. %) | 29.2 | 29.0 | 2.4 | 2.4 |
| Resist (ppm) | 3100 | 1280 | 6 | <0.1 |
| Na (ppb) | 1670 | 1650 | 420 | <10 |
| Fe (ppb) | 1650 | 1020 | 12 | <10 |
| Al (ppb) | 570 | 340 | <10 | <10 |
| $SiO_2$ (ppm) | 24.5 | 3.7 | 0.3 | <0.2 |

Comparative Example 1

Electrodialysis was carried out using Sample Solution 1 itself in Example 1 as the starting solution in the same manner as in Example 2 until the TMAH concentration of the solution of TMAH recovered into ultrapure water (concentrating liquid) reached 2.4 wt. % at a TMAH recovery of 80%. The ED concentrate obtained by this electrodialysis was then subjected to substantially the same ion exchange treatment as in Example 2 to obtain an IE-treated solution. The results of analyses of the ED concentrate and the IE-treated solution are shown in Table 4, which also includes data listed in Table 1. Additionally stated, the analytical methods were the same as in Example 1.

TABLE 4

| Sample Solution 1 | Starting Waste | ED Concentrate | IE-treated Solution |
|---|---|---|---|
| TMAH (wt. %) | 0.8 | 2.4 | 2.4 |
| Resist (ppm) | 477 | 15 | <0.1 |
| Na (ppb) | 1730 | 5740 | <10 |
| Fe (ppb) | 84 | 44 | 13 |
| Al (ppb) | 2210 | 210 | 110 |
| $SiO_2$ (ppm) | 2.6 | 1.5 | 0.8 |

Comparative Example 2

Electrodialysis was carried out using Sample Solution 2 itself in Example 1 as the starting solution in the same manner as in Example 2 until the TMAH concentration of the solution of TMAH recovered into ultrapure water (concentrating liquid) reached 2.4 wt. % at a TMAH recovery of 80%. The ED concentrate obtained by this electrodialysis was then subjected to substantially the same ion exchange treatment as in Example 2 to obtain an IE-treated solution. The results of analyses of the ED concentrate and the IE-treated solution are shown in Table 5, which also includes data listed in Table 1. Additionally stated, the analytical methods were the same as in Example 1.

TABLE 5

| Sample Solution 2 | Starting Waste | ED Concentrate | IE-treated Solution |
|---|---|---|---|
| TMAH (wt. %) | 29.2 | 2.4 | 2.4 |
| Resist (ppm) | 3100 | 8 | <0.1 |
| Na (ppb) | 1670 | 430 | <10 |
| Fe (ppb) | 1650 | 15 | <10 |
| Al (ppb) | 570 | 16 | <10 |
| $SiO_2$ (ppm) | 24.5 | 0.8 | 0.4 |

Example 4

Electrodialysis was carried out using the NF concentrate of Sample Solution 1 in Example 1 as the starting solution in the same manner as in Example 2 until the TMAH concentration of the solution of TMAH recovered into the NF permeate (concentrating liquid) of Sample Solution 1 from the residual TMAH in that NF concentrate reached 2.0 wt. %. The ED concentrate obtained by this electrodialysis was then subjected to substantially the same ion exchange treatment as in Example 2 to obtain an IE-treated solution. The results of analyses of the ED concentrate and the IE-treated solution are shown in Table 6, which also includes data listed in Table 1. Additionally stated, the analytical methods were the same as in Example 1.

TABLE 6

| Sample Solution 1 | Starting Waste | NF Permeate | NF Concentrate | ED Concentrate | IE-treated Solution |
|---|---|---|---|---|---|
| TMAH (wt. %) | 0.8 | 0.7 | 0.8 | 2.0 | 2.0 |
| Resist (ppm) | 477 | 28 | 687 | 31 | <0.1 |
| Na (ppb) | 1730 | 1120 | 2120 | 5530 | <10 |
| Fe (ppb) | 84 | 29 | 121 | 41 | 12 |
| Al (ppb) | 2210 | 260 | 3180 | 360 | 210 |
| $SiO_2$ (ppm) | 2.6 | 0.4 | 3.6 | 1.3 | 0.7 |

Example 5

The ED concentrate obtained in Comparative Example 2 was subjected to NF membrane separation treatment to obtain an NF permeate. The NF permeate was then subjected to substantially the same ion exchange treatment as in Example 2 to obtain an IE-treated solution. The results of analyses of the NF permeate and the IE-treated solution are shown in Table 7, which also includes data listed in Table 5. Additionally stated, the analytical methods were the same as in Example 1.

TABLE 7

| Sample Solution 2 | ED Concentrate | NF Permeate | IE-treated Solution |
|---|---|---|---|
| TMAH (wt. %) | 2.4 | 2.4 | 2.4 |
| Resist (ppm) | 8 | <0.1 | <0.1 |
| Na (ppb) | 430 | 390 | <10 |
| Fe (ppb) | 15 | <10 | <10 |
| Al (ppb) | 16 | <10 | <10 |
| SiO$_2$ (ppm) | 0.8 | <0.2 | <0.2 |

According to the process of the present invention for rejuvenation treatment of a photoresist development waste, a TAA ion-containing photoresist development waste further containing at least a photoresist is subjected to NF membrane separation treatment low in running cost and easy of operation, whereby the photoresist and other impurities can be removed into the NF concentrate easily to heighten the purity of the NF permeate mainly containing TAA ions.

Since NF membrane separation treatment can remove a considerable amount of impurities such as some metal component including Fe and Al, and silica, which are hard to remove even by ion exchange treatment, NF membrane separation treatment can effectively be used either instead of or in combination with ion exchange treatment.

Where a refining treatment operation(s) such for example as electrodialysis and/or electrolysis, and, if necessary, further ion exchange treatment and/or the like is effected in rejuvenation treatment of the photoresist development waste to obtain a rejuvenated developer for use in production of electronic parts such as semiconductor devices, liquid crystal displays or printed boards, or the like, wherein impurities must particularly be avoided, NF membrane separation treatment, when preliminarily done, can decrease the load of impurities (photoresist in particular) on the above-mentioned operation(s), whereby the total running cost of the system can be reduced.

When the NF permeate is passed through the concentrating cell(s) of an electrodialysis or electrolysis unit while passing the NF concentrate through the desalting cell(s) of the electrodialysis or electrolysis unit, the amount of wastewater discharged as the desalted waste can be decreased.

The entire disclosure of Japanese Patent Application No. 10-010025 (i.e., 10,025/1998) filed on Jan. 5, 1998 including specification, claims, drawings and summary is incorporated herein by reference in its entirety.

What is claimed is:

1. A process for rejuvenation treatment of a photoresist development waste mainly containing a photoresist and tetraalkylammonium ions, comprising at least the membrane separation step (A) of treating said photoresist development waste or a treated solution derived from said photoresist development waste with a nanofiltration membrane (NF membrane) to obtain a concentrate mainly containing impurities such as said photoresist and a permeate mainly containing tetraalkylammonium ions.

2. A process for rejuvenation treatment of a photoresist development waste as claimed in claim 1, wherein said membrane separation step (A) is effected in multiple stages.

3. A process for rejuvenation treatment of a photoresist development waste as claimed in claim 1, wherein said treated solution derived from said photoresist development waste is a treated solution obtained by subjecting said development waste to at least one pretreatment step selected from the group consisting of a concentration treatment step (a) of obtaining a concentrate as said treated solution by at least one concentration method selected from the group consisting of reverse osmosis membrane treatment, evaporation, electrodialysis and electrolysis, a chromatographic separation step (b) of obtaining a tetraalkylammonium ion fraction as said treated solution by a chromatographic separation method, a neutralization+solid-liquid separation step (c) of removing the photoresist insolubilized by neutralization according to solid-liquid separation, and an ion exchange treatment step (d) of removing some impurities by adsorption thereof on an ion exchanger through contact therebetween.

4. A process for rejuvenation treatment of a photoresist development waste as claimed in claim 1, wherein the pH of said photoresist development waste or said treated solution derived from said photoresist development waste is adjusted to a value falling within the range of 9.5 to 12 before the step (A).

5. A process for rejuvenation treatment of a photoresist development waste as claimed in claim 1, wherein after the step (A), said permeate and/or said concentrate is further subjected to at least one step selected from the group consisting of an ion exchange treatment step (B) of removing impurities by adsorption thereof on an ion exchange resin through contact therebetween, a concentration step (C) of obtaining a concentrate by at least one concentration method selected from the group consisting of reverse osmosis membrane treatment and evaporation, a concentration and refining step (D) of concentrating tetraalkylammonium ions by at least one method selected from the group consisting of electrodialysis and electrolysis, and a chromatographic separation step (E) of obtaining a tetraalkylammonium ion fraction by a chromatographic separation method.

6. A process for rejuvenation treatment of a photoresist development waste as claimed in claim 5, wherein said concentrate and said permeate both obtained through the step (A) are used as a solution to be desalted and a tetraalkylammonium ion concentrating liquid, respectively, in electrodialysis and/or electrolysis in the step (D).

7. A process for rejuvenation treatment of a photoresist development waste as claimed in claim 5, wherein said ion exchange resin for use in the step (B) is an anion exchange resin and/or a cation exchange resin in at least one of the hydrogen ion form (H form) and the tetraalkylammonium ion form (TAA form).

8. A process for rejuvenation treatment of a photoresist development waste as claimed in claim 1, wherein a membrane treatment unit is disposed at or near the terminal of the system involved in the process to remove fine particles from a solution of the tetraalkylammonium hydroxide as the rejuvenated developer.

* * * * *